US009146540B2

(12) United States Patent
Youngner et al.

(10) Patent No.: US 9,146,540 B2
(45) Date of Patent: Sep. 29, 2015

(54) FABRICATION TECHNIQUES TO ENHANCE PRESSURE UNIFORMITY IN ANODICALLY BONDED VAPOR CELLS

(75) Inventors: Daniel W. Youngner, Maple Grove, MN (US); Jeff A. Ridley, Shorewood, MN (US); Son T. Lu, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 553 days.

(21) Appl. No.: 13/570,363

(22) Filed: Aug. 9, 2012

(65) Prior Publication Data

US 2012/0298295 A1 Nov. 29, 2012

Related U.S. Application Data

(62) Division of application No. 12/879,394, filed on Sep. 10, 2010, now Pat. No. 8,299,860.

(60) Provisional application No. 61/301,497, filed on Feb. 4, 2010.

(51) Int. Cl.
*H01L 31/02* (2006.01)
*G04F 5/14* (2006.01)

(52) U.S. Cl.
CPC ........... *G04F 5/14* (2013.01); *Y10T 428/24149* (2015.01)

(58) Field of Classification Search
CPC ......... H01L 21/30; H01L 21/46; H01L 21/50; H01L 31/018; H01L 31/024; H01L 31/1804; H01L 31/0224; H01L 29/82
USPC ........................... 438/455; 257/E21.482, 567
See application file for complete search history.

(56) References Cited

U.S. PATENT DOCUMENTS 5,141,148 A * 8/1992 Ichiyawa ...................... 228/121
6,486,008 B1 * 11/2002 Lee .............................. 438/149

(Continued)

FOREIGN PATENT DOCUMENTS

EP 1591846 11/2005
EP 2136272 12/2009

(Continued)

OTHER PUBLICATIONS

U.S. Patent and Trademark Office, "Notice of Allowance and Fee(s) Due", U.S. Appl. No. 13/662,850, Nov. 5, 2014, pp. 1-19.

(Continued)

*Primary Examiner* — Michael Lebentritt
(74) *Attorney, Agent, or Firm* — Fogg & Powers LLC

(57) ABSTRACT

A method of fabricating vapor cells comprises forming a plurality of vapor cell dies in a first wafer having an interior surface region and a perimeter, and forming a plurality of interconnected vent channels in the first wafer. The vent channels provide at least one pathway for gas from each vapor cell die to travel outside of the perimeter of the first wafer. The method further comprises anodically bonding a second wafer to one side of the first wafer, and anodically bonding a third wafer to an opposing side of the first wafer. The vent channels allow gas toward the interior surface region of the first wafer to be in substantially continuous pressure-equilibrium with gas outside of the perimeter of the first wafer during the anodic bonding of the second and third wafers to the first wafer.

10 Claims, 3 Drawing Sheets

(56) References Cited

U.S. PATENT DOCUMENTS

| | | | | |
|---|---|---|---|---|
| 6,570,459 | B1 | 5/2003 | Nathanson et al. | |
| 7,292,111 | B2 | 11/2007 | Abbink et al. | |
| 7,400,207 | B2 | 7/2008 | Lipp et al. | |
| 7,666,485 | B2 | 2/2010 | Lal et al. | |
| 7,902,927 | B2 | 3/2011 | Davis et al. | |
| 8,067,991 | B2 | 11/2011 | Youngner et al. | |
| 8,129,257 | B2 | 3/2012 | Liang | |
| 8,218,590 | B2 | 7/2012 | Youngner et al. | |
| 8,242,851 | B2 | 8/2012 | Younger et al. | |
| 2005/0007118 | A1 | 1/2005 | Kitching et al. | |
| 2005/0184815 | A1 | 8/2005 | Lipp et al. | |
| 2005/0236460 | A1 | 10/2005 | Abbink et al. | |
| 2006/0022761 | A1* | 2/2006 | Abeles et al. | 331/94.1 |
| 2007/0111471 | A1* | 5/2007 | Okada | 438/455 |
| 2008/0164606 | A1* | 7/2008 | Greisen et al. | 257/726 |
| 2008/0218281 | A1 | 9/2008 | Lipp et al. | |
| 2008/0280124 | A1* | 11/2008 | Eklund et al. | 428/315.9 |
| 2010/0084284 | A1 | 4/2010 | Happer et al. | |
| 2011/0091687 | A1* | 4/2011 | Haque et al. | 428/156 |
| 2011/0147367 | A1* | 6/2011 | Borwick et al. | 219/482 |
| 2011/0187464 | A1 | 8/2011 | Younger et al. | |
| 2011/0187465 | A1 | 8/2011 | Youngner et al. | |
| 2011/0189429 | A1* | 8/2011 | Youngner et al. | 428/116 |
| 2012/0285198 | A1* | 11/2012 | Shang | 65/22 |
| 2013/0052405 | A1* | 2/2013 | Youngner et al. | 428/116 |
| 2014/0301697 | A1* | 10/2014 | Marenco et al. | 385/31 |

FOREIGN PATENT DOCUMENTS

| | | |
|---|---|---|
| JP | 2001129799 | 5/2001 |
| JP | 2007329226 | 12/2007 |
| JP | 2009212416 | 9/2009 |
| JP | 2009215099 | 9/2009 |
| JP | 2009283526 | 12/2009 |

OTHER PUBLICATIONS

Japanese Patent Office, "Notice of Allowance from JP Application No. 2010-252833 mailed Aug. 27, 2014", from Foreign Counterpart of U.S. Appl. No. 12/879,394, Aug. 27, 2014, pp. 1-4, Published in: JP.

Japanese Patent Office, "Office Action from JP Application No. 2010-252833 mailed May 19, 2014", "from foreign counterpart of U.S. Appl. No. 12/879,394", May 19, 2014, pp. 1-4, Published in: JP.

Becerra et al., "Two-Photon Dichroic Atomic Vapor Laser Lock Using Electromagnetically Induced Transparency and Absorption", Jul. 2009, pp. 1315-1320, vol. 26, No. 7, Publisher: Optical Society of America.

Douahi et al, "New Vapor Cell Technology for Chip Scale Atomic Clock", "Frequency Control Symposium", May 1, 2007, pp. 58-61, Publisher: IEEE.

European Patent Office, "Office Action" from Foreign Counterpart of U.S. Appl. No. 12/873,441, Oct. 19, 2011, Published in: EP.

European Patent Office, "European Search Report" from Foreign Counterpart of U.S. Appl. No. 12/873,441, mailed Oct. 4, 2011, Published in: EP.

Hasegawa et al, "Fabrication of wall-coated Cs vapor cells for a chip-scale atomic clock", "Optical MEMS and Nanophotonics", Aug. 11, 2008, pp. 162-163, Publisher: IEEE.

"Chip Scale Atomic Clock (CSAC)", "http://www.honeywell.com/sites/aero/technology/avionics3_CA0A2F626-AEE9-48DE-12E5-47CBFC1208EB_HE6088161-0A4F-E40C-C64C-B10F14E21C72.htm", at least as early as Aug. 16, 2010, p. 1, Publisher: Honeywell.

Knappe et al., "Atomic Vapor Cells for Chip-Scale Atomic Clocks With Improved Long-Term Frequency Stability", "Optics Letters", Sep. 15, 2005, pp. 2351-2353, vol. 30, No. 18, Published in: USA.

Liew et al., "Microfabricated alkali atom vapor cells", "Applied Physics Letters", Apr. 5, 2004, pp. 2694-2696, vol. 84, No. 14, Publisher: American Institute of Physics.

Liew et al., "Micromachined Alkali Atom Vapor Cells for Chip-Scale Atomic Clocks", "National Institute of Standards and Technology", Sep. 27, 2004, pp. 113-116, Publisher: IEEE.

Lutwak, et al., "The Chip-Scale Atomic Clock—Coherent Population Trapping vs. Conventional Interrogation", "34th Annual Precise Time and Time Interval (PTTI) Meeting", Dec. 2002, pp. 539-550, Publisher: Symmetricom-Technology Realization Center, Published in: Beverly, MA, USA.

Moreland et al., "Chip Scale Atomic Magnetometers", "Proceedings of the 2005 Meeting of the Military Sensing Symposium, Aug. 22-25, Laurel, MD 2005", Aug. 5, 2005, pp. 1-10, Published in: USA.

Nieradko et al, "New approach of fabrication and dispensing of micromachined cesium vapor cell", Jan. 1, 2008, pp. 1-6, vol. 7, No. 3, Publisher: Journal of Microlithography, Microfabrication, and Microsystems.

U.S. Patent and Trademark Office, "Notice of Allowance", "U.S. Appl. No. 12/879,394", Jun. 27, 2012.

U.S. Patent and Trademark Office, "Office Action", "U.S. Appl. No. 12/873,441", Dec. 14, 2011.

Schwindt et al., "Chip-Scale Atomic Magnetometer", "Applied Physics Letters", Dec. 27, 2004, pp. 6409-6411, vol. 85, No. 26, Publisher: American Institute of Physics, Published in: USA.

European Patent Office, "Communication under Rule 71(3) EPC", "from Foreign Counterpart of U.S. Appl. No. 12/879,394", May 21, 2012, pp. 1-7, Published in: EP.

European Patent Office, "European Search Report", "from Foreign Counterpart of U.S. Appl. No. 12/879,394", Oct. 4, 2011, pp. 1-4, Published in: EP.

European Patent Office, "European Office Action", "from Foreign Counterpart of U.S. Appl. No. 12/879,394", Oct. 19, 2011, pp. 1-5, Published in: EP.

* cited by examiner

FABRICATION TECHNIQUES TO ENHANCE PRESSURE UNIFORMITY IN ANODICALLY BONDED VAPOR CELLS

CROSS-REFERENCE TO RELATED APPLICATION

This application is a divisional of U.S. application Ser. No. 12/879,394, filed on Sep. 10, 2010, which claims the benefit of U.S. Provisional Patent Application Ser. No. 61/301,497, filed on Feb. 4, 2010, both of which are incorporated herein by reference.

GOVERNMENT LICENSE RIGHTS

The U.S. Government may have certain rights in the present invention as provided for by the terms of Government Contract prime number FA8650-07-C-1125 with the U.S. Air Force.

BACKGROUND

Chip-Scale Atomic Clocks (CSACs) include vapor cells that contain vapors of an alkali metal such as rubidium (Rb). The vapor cells also typically contain a buffer gas, such as an argon-nitrogen buffer gas blend. The standard technique for fabricating the vapor cells involves anodically bonding two glass wafers on opposing sides of a silicon wafer having a plurality of cell structures that define cavities. The alkali metal vapor and buffer gas are trapped in the cavities of the cell structures between the two glass wafers.

The anodic bond joint starts at the locations between the wafers that are initially in contact and spreads out as the electrostatic potential brings the surfaces together. This lag of the bond front from one area to the next can lead to pressure differences in the vapor cells. Additionally, the presence of a low boiling temperature material like Rb requires the bonding to take place at as low a temperature as possible, otherwise the vapor generated can foul the bond surface. Thus, a high voltage needs to be applied as the wafers are heating, to allow the bond to form as soon as possible. This can result in vapor cells sealing at different times, and thus at different temperatures, which can result in pressure differences in the vapor cells, even on cells that are fabricated side-by-side on the same wafer.

Further, total thickness variations in the two glass wafers cause some of the vapor cells to become hermetically sealed before other vapor cells on the same set of wafers. This problem is further exacerbated in that the temperature is gradually ramped in the bonder equipment, driving some of the trapped gas out of vapor cells that bond late. In addition, there are no easy escape paths for buffer gas that gets trapped in regions that bond late, which can lead to pressure differences in the vapor cells.

SUMMARY

A method of fabricating vapor cells comprises forming a plurality of vapor cell dies in a first wafer having an interior surface region and a perimeter, and forming a plurality of interconnected vent channels in the first wafer. The vent channels provide at least one pathway for gas from each vapor cell die to travel outside of the perimeter of the first wafer. The method further comprises anodically bonding a second wafer to one side of the first wafer, and anodically bonding a third wafer to an opposing side of the first wafer. The vent channels allow gas toward the interior surface region of the first wafer to be in substantially continuous pressure-equilibrium with gas outside of the perimeter of the first wafer during the anodic bonding of the second and third wafers to the first wafer.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Fabrication techniques are provided for enhancing gas pressure uniformity in anodically bonded vapor cells used in Chip-Scale Atomic Clocks (CSACs). In general, the vapor cells are fabricated with a pair of optically clear glass wafers that are anodically bonded to opposing sides of a substrate such as a silicon wafer having a plurality of cell structures. The vapor cells are fabricated prior to assembly within a physics package for the CSAC.

In one approach for enhancing gas pressure uniformity during vapor cell fabrication, a design feature is incorporated into a wafer surface that creates interconnected vent channels that provide a path from each vapor cell die in the wafer to the perimeter of the wafer. The vent channels allow gas near the interior of the wafer to be in substantially continuous pressure-equilibrium with gas outside of the wafer during anodic bonding. In another approach for enhancing gas pressure uniformity, the anodic bonding process is modified to continually ramp pressure upward as temperature is ramped upward.

The foregoing approaches can be combined such that utilizing the vent channels in the silicon wafer surface along with pressure ramping allows vapor cells that are sealed later in the process, and thus at higher temperature, to also have a higher gas pressure. When cooled to room temperature, the vapor cells sealed at a higher temperature will drop in pressure more than those sealed at a lower temperature. With a higher gas pressure, the later sealing vapor cells can be compensated so the final pressure of all vapor cells is about the same at room temperature.

Further details of the present fabrication techniques are described hereafter with reference to the drawings.

Figure 1:
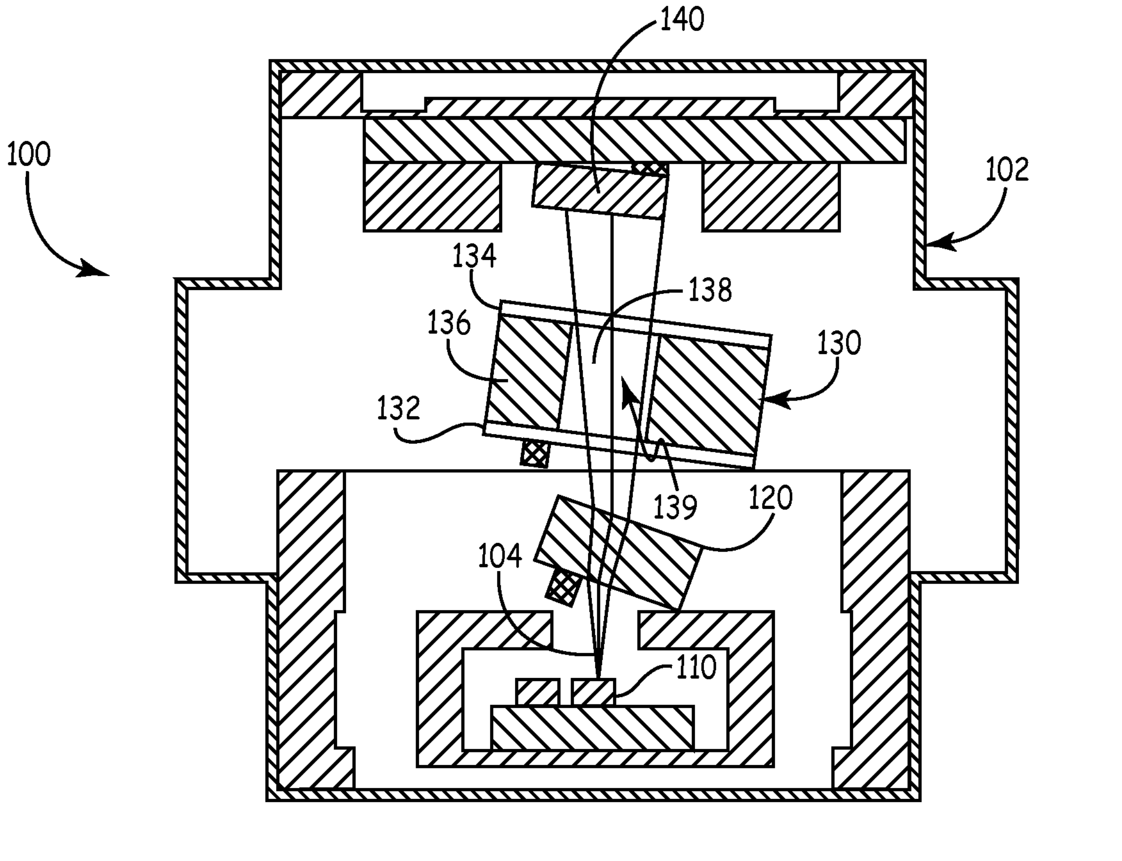
FIG. 1 is a cross-sectional schematic depiction of a physics package for a chip-scale atomic clock that includes a vapor cell according to one embodiment.

FIG. 1 illustrates a CSAC 100 according to one embodiment, which can employ a vapor cell fabricated according to the present approach. The CSAC 100 includes a physics package 102, which houses various mechanical and electronic components of CSAC 100. These components can be fabricated as wafer-level micro-electro-mechanical systems (MEMS) devices prior to assembly in physics package 102. In general, the CSAC components in package 102 include a laser die 110 such as a vertical-cavity surface-emitting laser (VCSEL), a quarter wave plate (QWP) 120 in optical communication with laser die 110, a vapor cell 130 in optical communication with QWP 120, and an optical detector 140 in optical communication with vapor cell 130.

A laser beam 104 emitted from laser die 100 is directed to pass through QWP 120 and vapor cell 130 to optical detector 140. As shown in FIG. 1, QWP 120, vapor cell 130, and optical detector 140 can be mounted within package 102 at various tilt angles with respect to the optical path of laser beam 104. Tilting these components reduces reflective coupling back into the VCSEL, enhancing CSAC stability.

The vapor cell 130 includes a pair of optically clear glass wafers 132 and 134 that are anodically bonded to opposing sides of a substrate such as a silicon wafer 136. Exemplary glass wafers include Pyrex glass or similar glasses. At least one chamber 138 defined within vapor cell 130 provides an optical path 139 between laser die 110 and optical detector 140 for laser beam 104.

In one approach for fabricating vapor cell 130 prior to assembly within package 102, glass wafer 132 is initially anodically bonded to a base side of substrate 136, after which rubidium or other alkali metal (either in liquid or solid form) is deposited into chamber 138. The glass wafer 134 is then anodically bonded to the opposing side of silicon wafer 136 to form vapor cell 130. Such bonding typically is accomplished at temperatures from about 250° C. to about 400° C. The bonding process is performed with the wafers 132, 134, 136 either under high vacuum or backfilled with a buffer gas, such as an argon-nitrogen gas mixture. When the buffer gas is used, the manufacturing equipment containing the components for vapor cell 130 is evacuated, after which the buffer gas is backfilled into chamber 138. Thus, when the bonding is completed to seal vapor cell 130, the alkali metal and optional buffer gas are trapped within chamber 138.

During the anodic bonding process, the glass wafers, which contain mobile ions such as sodium, are brought into contact with the silicon wafer, with an electrical contact to both the glass and silicon wafers. Both the glass and silicon wafers are heated to at least about 200° C., and a glass wafer electrode is made negative, by at least about 200 V, with respect to the silicon wafer. This causes the sodium in the glass to move toward the negative electrode, and allows for more voltage to be dropped across the gaps between the glass and silicon, causing more intimate contact. At the same time, oxygen ions are released from the glass and flow toward the silicon, helping to form a bridge between the silicon in the glass and the silicon in the silicon wafer, which forms a very strong bond. The anodic bonding process can be operated with a wide variety of background gases and pressures, from well above atmospheric to high vacuum. Higher gas pressures improve heat transfer, and speed up the process. In the case of Rb vapor cells, it is desirable to form a bond at as low a temperature as possible, in the presence of a buffer gas.

Figure 2:
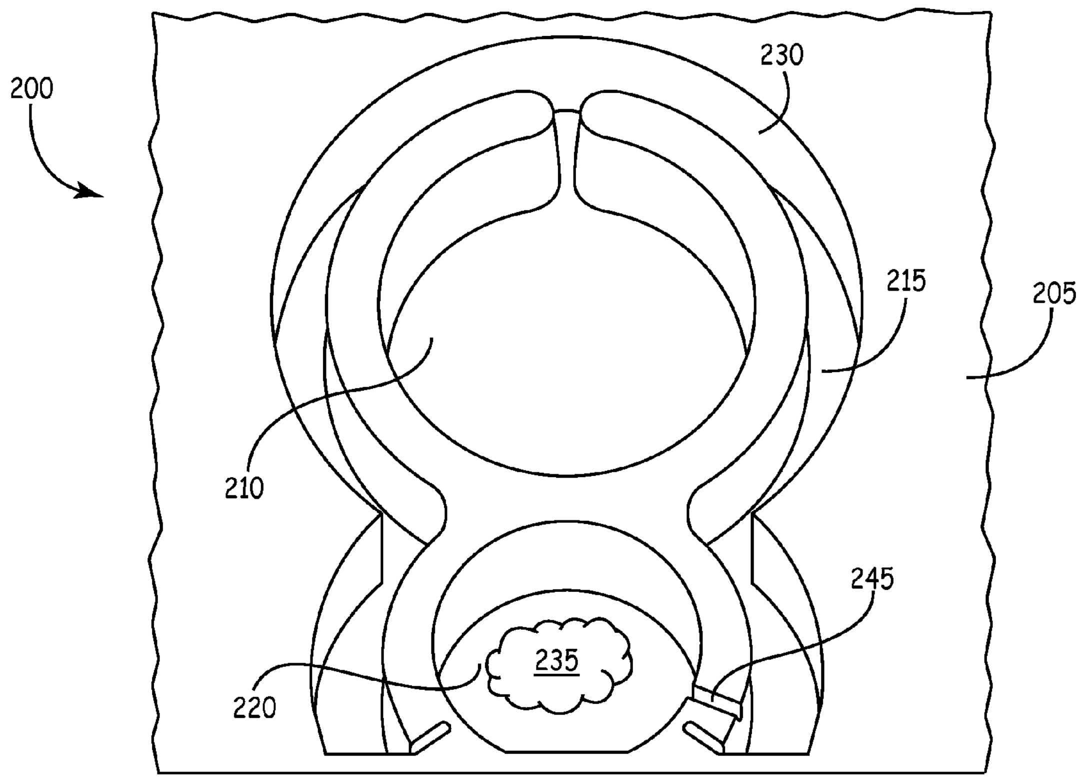
FIG. 2 is a schematic diagram of one embodiment of a vapor cell die for a chip-scale atomic clock that has been formed on a wafer layer.

FIG. 2 illustrates one embodiment of a vapor cell die 200 for a CSAC that has been formed on a wafer layer. The vapor cell die 200 includes a silicon substrate 205 in which a first chamber 210, a second chamber 220, and at least one connecting pathway 215 have been formed. The chambers 210, 220, and pathway 215 are sealed within vapor cell die 200 between glass wafers (such as glass wafers 132, 134) using anodic bonding as described above.

For the embodiment shown in FIG. 2, chamber 210 comprises part of the optical path for the CSAC and needs to be kept free of contaminants and precipitates. The rubidium or other alkali metal (shown generally at 235) is deposited as a liquid or solid into chamber 220. The connecting pathway 215 establishes a "tortuous path" (illustrated generally at 230) for the alkali metal vapor molecules to travel from second chamber 220 to first chamber 210. Because of the dynamics of gas molecules, the alkali metal vapor molecules do not flow smoothly through pathway 215, but rather bounce off of the walls of pathway 215 and frequently stick to the walls. In one embodiment, second chamber 220 is isolated from pathway 215 except for a shallow trench 245 to further slow migration of alkali metal vapor from the second chamber 220.

Further details related to fabricating a suitable vapor cell for use in the CSAC are described in U.S. application Ser. No. 12/873,441, filed Sep. 1, 2010, and published as Pub. No. US 2011/0187464 A1, the disclosure of which is incorporated herein by reference.

As discussed previously, the anodic bond joint starts at the locations between the wafers that are initially in contact and spreads out as the electrostatic potential brings the surfaces together. This lag of the bond front from one area to the next can lead to pressure differences if there is no path for gas to move out from between the wafers as the bond fronts move together. This can result in poor buffer gas uniformity in the fabricated vapor cells.

Furthermore, using a low melting temperature material like Rb requires the bonding to take place at as low a temperature as possible, otherwise the vapor generated can foul the bond surface. Thus, a high voltage needs to be applied as the wafers are heating, to allow the bond to form as soon as possible. This can result in vapor cells sealing at different times, and thus at different temperatures, which can also produce pressure differences in the fabricated vapor cells.

The problem of poor buffer gas uniformity in fabricated vapor cells can be solved using the techniques discussed hereafter.

Figure 3:
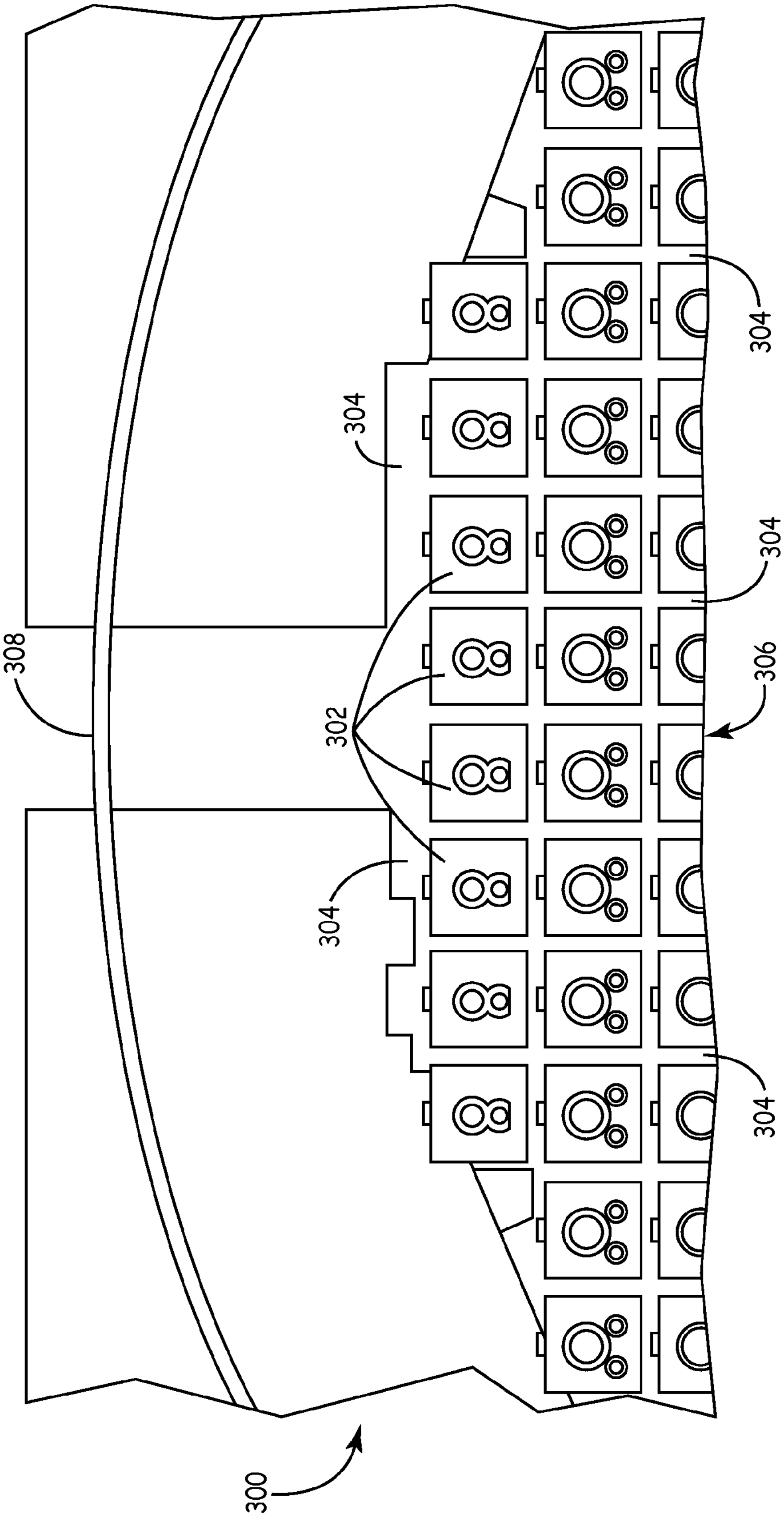
FIG. 3 is partial plan view of a wafer with a plurality of vapor cell dies and vent channels according to one embodiment.

In one approach, vent channels are formed in a surface of the silicon wafer in order to provide pathways for gas to escape to a perimeter of the wafer during anodic bonding. This approach is illustrated in FIG. 3, which shows a wafer 300 for fabricating vapor cells used in a CSAC. The wafer 300 includes a plurality of vapor cell dies 302 and interconnected vent channels 304 that surround vapor cell dies 302. The vapor cell dies 302 and vent channels 304 are located in an interior surface region 306 of wafer 300. The vent channels 304 can be formed with the same processes used to form vapor cell dies 302.

The vent channels 304 provide at least one pathway for gas from each vapor cell die to travel outside of a perimeter 308 of wafer 300. The vent channels 304 allow gas toward the interior surface region 306 to be in substantially continuous pressure-equilibrium with gas outside of perimeter 308 during anodic bonding of glass wafers to opposing sides of wafer 300.

In another approach for enhancing gas pressure uniformity, the anodic bonding process is modified to continually ramp pressure upward as temperature (measured in degrees Kelvin, or degrees absolute) is ramped upward. In this approach, anodic bonding of a first wafer such as a silicon wafer is carried out by increasing a temperature of the first wafer at predetermined rate during anodic bonding of the first wafer to a second wafer such as a glass wafer. The silicon wafer has a plurality of dies each with at least one chamber. A gas pressure between the first and second wafers is also increased at a predetermined rate while the temperature is increasing during anodic bonding.

For example, in one implementation, as the temperature is increased from about 150° C. (423° K) to about 350° C. (623° K) during anodic bonding, the pressure is increased from about 296 torr to about 436 torr.

The foregoing approaches can be combined such that utilizing the vent channels in the wafer surface along with pressure ramping allows vapor cells that are sealed later in the process, and thus at higher temperature, to also have a higher gas pressure. When cooled to room temperature, the vapor cells sealed at a higher temperature will drop in pressure more than those sealed at a lower temperature. With a higher gas pressure, the later sealing vapor cells can be compensated so the final pressure of all vapor cells is about the same at room temperature. By keeping the ratio of the pressure to the temperature constant, the ideal gas law ensures than n (the molar density of the gas in the cells) will remain constant across the wafer.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method for enhancing gas pressure uniformity during anodic bonding, the method comprising:

providing a first wafer comprising a plurality of vapor cell dies each with at least one chamber;

increasing a temperature of the first wafer at a first rate during anodic bonding of the first wafer to a second wafer; and increasing a gas pressure between the first and second wafers at a second rate while the temperature is increasing.

2. The method of claim 1, wherein the first wafer comprises a silicon wafer, and the second wafer comprises a glass wafer.

3. The method of claim 1, wherein the temperature is increased from about 150° C. to about 350° C. during the anodic bonding.

4. The method of claim 3, wherein the pressure is increased from about 296 torr to about 436 torr during the anodic bonding.

5. The method of claim 1, further comprising:

increasing a temperature of the first wafer during anodic bonding of the first wafer to a third wafer on an opposing side from the second wafer; and increasing a gas pressure between the first wafer and the third wafer while the temperature is increasing during anodic bonding of the first wafer to the third wafer.

6. The method of claim 5, wherein the first wafer comprises a silicon wafer, and the third wafer comprises a glass wafer.

7. A method for enhancing gas pressure uniformity during anodic bonding, the method comprising:

providing a silicon wafer comprising a plurality of vapor cell dies, wherein each of the vapor cell dies comprises a substrate having a first chamber, a second chamber, and at least one connecting pathway between the first and second chambers;

increasing a temperature of the silicon wafer at a first rate during anodic bonding of the silicon wafer to a first glass wafer; and increasing a gas pressure between the silicon wafer and the first glass wafer at a second rate while the temperature is increasing.

8. The method of claim 7, wherein the temperature is increased from about 150° C. to about 350° C. during the anodic bonding.

9. The method of claim 8, wherein the pressure is increased from about 296 torr to about 436 torr during the anodic bonding.

10. The method of claim 7, further comprising:

increasing a temperature of the silicon wafer during anodic bonding of the silicon wafer to a second glass wafer on an opposing side from the first glass wafer; and increasing a gas pressure between the silicon wafer and the second glass wafer while the temperature is increasing during anodic bonding of the silicon wafer to the second glass wafer.

* * * * *